(12) United States Patent
Yusuf et al.

(10) Patent No.: US 11,018,649 B2
(45) Date of Patent: May 25, 2021

(54) COMPENSATION OF ON-DIE INDUCTIVE PARASITICS IN LADDER FILTERS THROUGH NEGATIVE MUTUAL INDUCTANCE BETWEEN GROUND INDUCTORS

(71) Applicant: Qorvo US, Inc., Greensboro, NC (US)

(72) Inventors: Yazid Yusuf, Orlando, FL (US); Mudar Al-Joumayly, Casselberry, FL (US); Gernot Fattinger, Sorrento, FL (US)

(73) Assignee: Qorvo US, Inc., Greensboro, NC (US)

( * ) Notice: Subject to any disclaimer, the term of this patent is extended or adjusted under 35 U.S.C. 154(b) by 95 days.

(21) Appl. No.: 16/404,199

(22) Filed: May 6, 2019

(65) Prior Publication Data
US 2020/0358419 A1 Nov. 12, 2020

(51) Int. Cl.
| | | |
|---|---|---|
| H03H 9/02 | (2006.01) | |
| H03H 9/13 | (2006.01) | |
| H03H 9/205 | (2006.01) | |
| H03H 9/54 | (2006.01) | |
| H03H 3/02 | (2006.01) | |
| H05K 1/02 | (2006.01) | |
| H03H 9/56 | (2006.01) | |

(52) U.S. Cl.
CPC .......... *H03H 9/02125* (2013.01); *H03H 3/02* (2013.01); *H03H 9/13* (2013.01); *H03H 9/205* (2013.01); *H03H 9/542* (2013.01); *H03H 9/568* (2013.01); *H05K 1/0243* (2013.01); *H05K 2201/1006* (2013.01); *H05K 2201/10083* (2013.01)

(58) Field of Classification Search
CPC ........ H03H 9/02125; H03H 3/02; H03H 9/13; H03H 9/205; H03H 9/542; H03H 9/568; H05K 1/0243; H05K 2201/1006; H05K 2201/10083

USPC ......................................................... 333/189
See application file for complete search history.

(56) References Cited

U.S. PATENT DOCUMENTS

2016/0191012 A1* 6/2016 Khlat .................... H03H 9/605
 333/189

OTHER PUBLICATIONS

"Z Parameters of the Coupled Inductors Network", Wireless Square, Open source wireless power technology, wireless-square.com/2016/11/04/z-parameters-of-the-coupled-inductors-network/, p. 1-12 (Year: 2016).*

* cited by examiner

*Primary Examiner* — Benny T Lee
*Assistant Examiner* — Hafizur Rahman
(74) *Attorney, Agent, or Firm* — Withrow & Terranova, P.L.L.C.

(57) ABSTRACT

Compensation of on-die inductive parasitics in ladder filters through negative mutual inductance between ground inductors is disclosed herein. An exemplary ladder filter includes a primary arm of series resonators and two or more shunt resonator arms connecting nodes between the series resonators to ground. The resonators of the ladder filter are disposed over a semiconductor substrate, to form a circuit die. Constructed ladder filter dice may fail to achieve design filter rejection due to inductive parasitics (e.g., undesired magnetic induction between components). A first shunt arm and a second shunt arm are provided with mutual negatively coupled inductors in order to compensate for these parasitics and improve filter performance.

18 Claims, 7 Drawing Sheets

COMPENSATION OF ON-DIE INDUCTIVE PARASITICS IN LADDER FILTERS THROUGH NEGATIVE MUTUAL INDUCTANCE BETWEEN GROUND INDUCTORS

FIELD OF THE DISCLOSURE

This application relates generally to electronic filtering circuits, and more particularly to ladder filter circuits using resonators.

BACKGROUND

Electronic filter circuits perform signal processing functions in communications systems, such as removal of undesired frequency components or enhancement of desired frequency components from communications signals. Mobile devices in communications systems increasingly demand filter circuits having reduced sizes and stringent filtering responses. Acoustic wave and other resonators can be used for filter circuits, and are generally disposed over a semiconductor substrate to form a circuit die. Performance of such filters can be affected by on-die parasitic effects.

SUMMARY

The present disclosure relates to compensation of on-die inductive parasitics in ladder filters through negative mutual inductance between ground inductors. An exemplary ladder filter includes a primary arm of series resonators and two or more shunt resonator arms connecting nodes between the series resonators to ground. The resonators of the ladder filter are disposed over a semiconductor substrate, to form a circuit die. Constructed ladder filter dice may fail to achieve design filter rejection due to inductive parasitics (e.g., undesired magnetic induction between components). A first shunt arm and a second shunt arm are provided with mutual negatively coupled inductors in order to compensate for these parasitics and improve filter performance.

An exemplary aspect relates to a radio frequency (RF) ladder filter. The RF ladder filter includes a plurality of resonators coupled in series between a first port and a second port. The RF ladder filter also includes a first shunt arm coupled between a first node in the plurality of resonators and a ground, comprising a first shunt resonator and a first shunt inductor coupled between the first shunt resonator and the ground. The RF ladder filter also includes a second shunt arm coupled between a second node in the plurality of resonators and the ground, comprising a second shunt resonator and a second shunt inductor coupled between the second shunt inductor and the ground and negatively coupled to the first shunt inductor.

Another exemplary aspect relates to a method for forming an RF ladder filter. The method includes providing a semiconductor substrate and forming a plurality of resonators in series over the semiconductor substrate. The method also includes forming a first shunt arm over the semiconductor substrate by forming a first shunt resonator coupled to a first node in the plurality of resonators and coupling a first shunt inductor to the first shunt resonator. The method also includes forming a second shunt arm over the semiconductor substrate by forming a second shunt resonator coupled to a second node in the plurality of resonators and coupling a second shunt inductor to the second shunt resonator. The second shunt inductor is disposed over the first shunt inductor such that a first current through the first shunt inductor flows an opposing direction from a second current through the second shunt inductor.

Another exemplary aspect relates to an RF bandpass filter. The RF bandpass filter includes a primary arm comprising a first plurality of resonators coupled in series between a first port and a second port. The RF bandpass filter also includes a first shunt arm coupled at a first end of the first plurality of resonators and coupled to a ground, comprising a first shunt resonator and a first shunt inductor coupled between the first shunt resonator and the ground. The RF bandpass filter also includes a second shunt arm coupled at a second end of the first plurality of resonators and coupled to the ground, comprising a second shunt resonator and a second shunt inductor coupled between the second shunt inductor and the ground and negatively coupled to the first shunt inductor.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
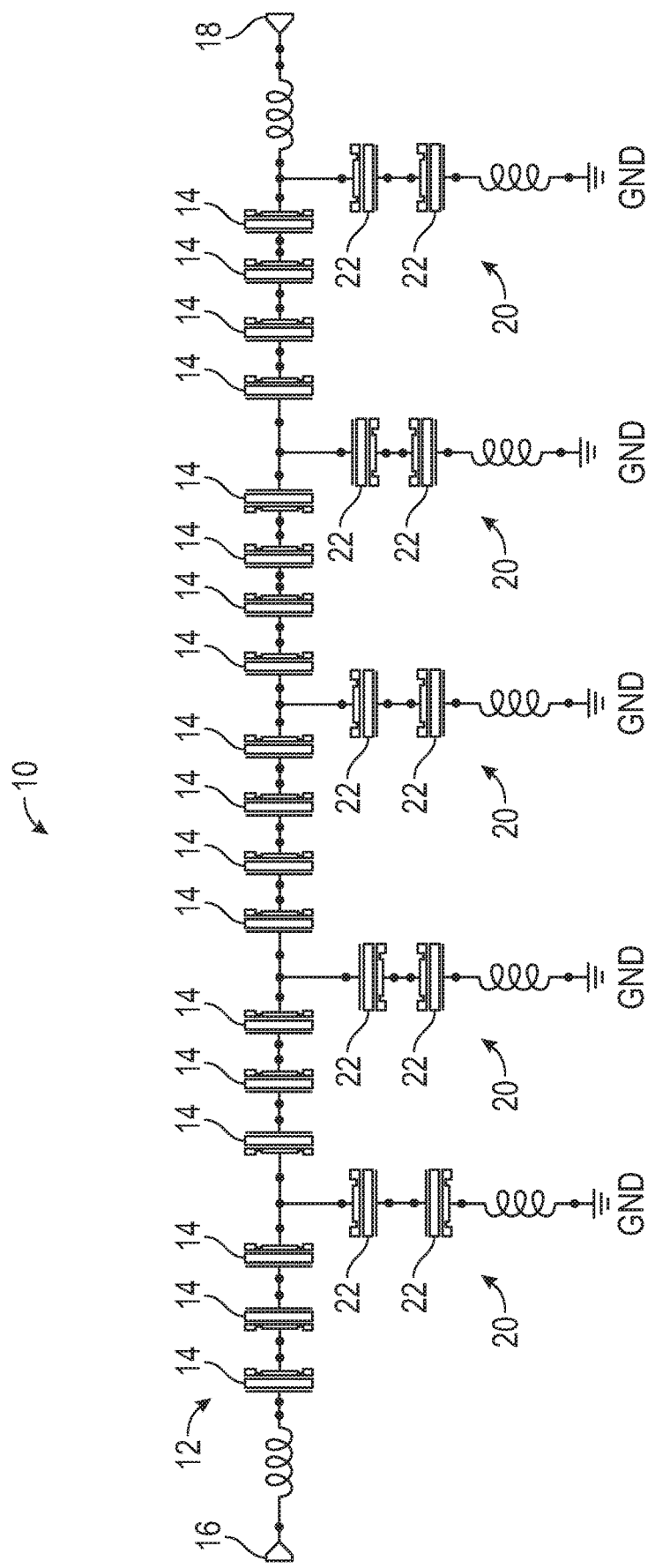
FIG. 1 is a schematic diagram of an exemplary radio frequency (RF) ladder filter.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to compensation of on-die inductive parasitics in ladder filters through negative mutual inductance between ground inductors. An exemplary ladder filter includes a primary arm of series resonators and two or more shunt resonator arms connecting nodes between the series resonators to ground. The resonators of the ladder filter are disposed over a semiconductor substrate, to form a circuit die. Constructed ladder filter dice may fail to achieve design filter rejection due to inductive parasitics (e.g., undesired magnetic induction between components). A first shunt arm and a second shunt arm are provided with mutual negatively coupled inductors in order to compensate for these parasitics and improve filter performance.

FIG. 1 is a schematic diagram of an exemplary radio frequency (RF) ladder filter 10. The RF ladder filter 10 includes a primary arm 12 having a plurality of ladder resonators 14 coupled in series between a first port 16 and a second port 18. A plurality of shunt arms 20 couple to a ground GND at nodes between the ladder resonators 14. Each of the plurality of shunt arms 20 includes one or more shunt resonators 22.

The RF ladder filter 10 is configured to receive an RF signal at the first port 16 or the second port 18, and output a filtered RF signal at the second port 18 or the first port 16, respectively. In an exemplary aspect, the RF ladder filter 10 is a bandpass filter. The ladder resonators 14 in the primary arm 12 define an upper band of the RF ladder filter 10, and the shunt resonators 22 in the shunt arms 20 define a lower band.

In an exemplary aspect, each of the ladder resonators 14 and the shunt resonators 22 is a bulk acoustic wave (BAW) resonator. In a practical implementation of the RF ladder filter 10 with BAW resonators, capacitive and inductive parasitic effects occur and degrade filter performance.

Figure 2:
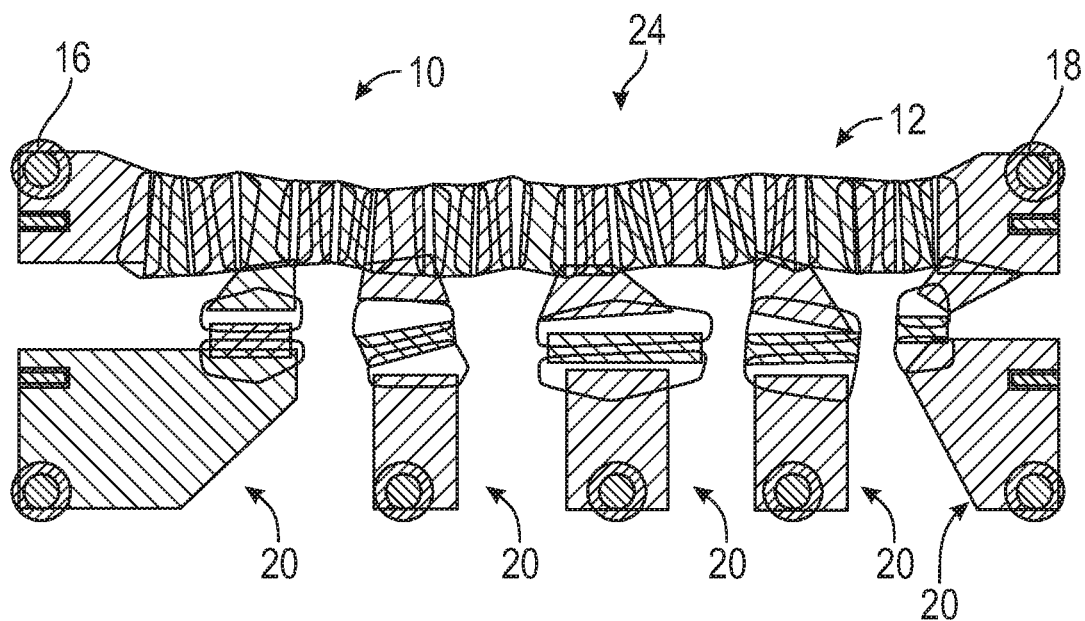
FIG. 2 illustrates a semiconductor die layout of the exemplary RF ladder filter of FIG. 1.

FIG. 2 illustrates a semiconductor die 24 of the exemplary RF ladder filter 10 of FIG. 1. The semiconductor die 24 includes the primary arm 12 coupled between the first port 16 and the second port 18, as well as the shunt arms 20, as described above with respect to FIG. 1. Current flowing through one part of the RF ladder filter 10 (e.g., through a BAW resonator, a conductive trace, and so on) induces potential differences in one or more other parts of the RF ladder filter 10 through magnetic induction. The interacting parts may not be adjacent physically or electrically, which causes the induced potential differences (e.g., induced signals) to cause undesired cross-talk which degrades rejection performance of the RF ladder filter 10, as shown further with respect to FIG. 3.

Figure 3:
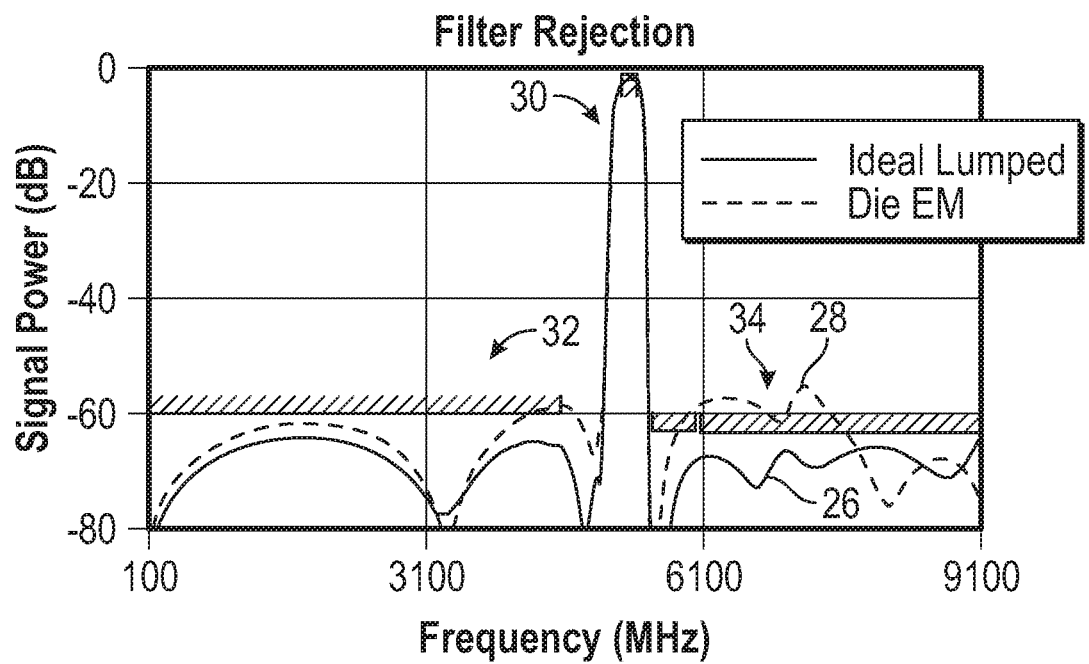
FIG. 3 is a graphical representation of filter performance, comparing ideal performance of the exemplary RF ladder filter of FIG. 1 with uncompensated performance of the semiconductor die of FIG. 2.

FIG. 3 is a graphical representation of filter performance, comparing ideal performance 26 of the exemplary RF ladder filter 10 of FIG. 1 with uncompensated performance 28 of the semiconductor die 24 of FIG. 2. In this regard, the exemplary RF ladder filter 10 is designed as a bandpass filter having a passband 30, a lower stopband 32 at frequencies below the passband 30, and an upper stopband 34 at frequencies above the passband 30.

As illustrated in FIG. 3, inductive parasitics in the semiconductor die 24 cause the uncompensated performance 28 to have lower rejection (e.g., higher signal power) in the lower stopband 32 and the upper stopband 34 as compared with the ideal performance 26. In particular, the ideal performance 26 in the upper stopband 34 has greater than 60 decibels (dB) of rejection, but the uncompensated performance 28 of the semiconductor die 24 is below 60 dB. Therefore, exemplary aspects of the present disclosure particularly compensate for inductive parasitic effects through negative mutual inductance between shunt inductors coupled to ground.

Figure 4:
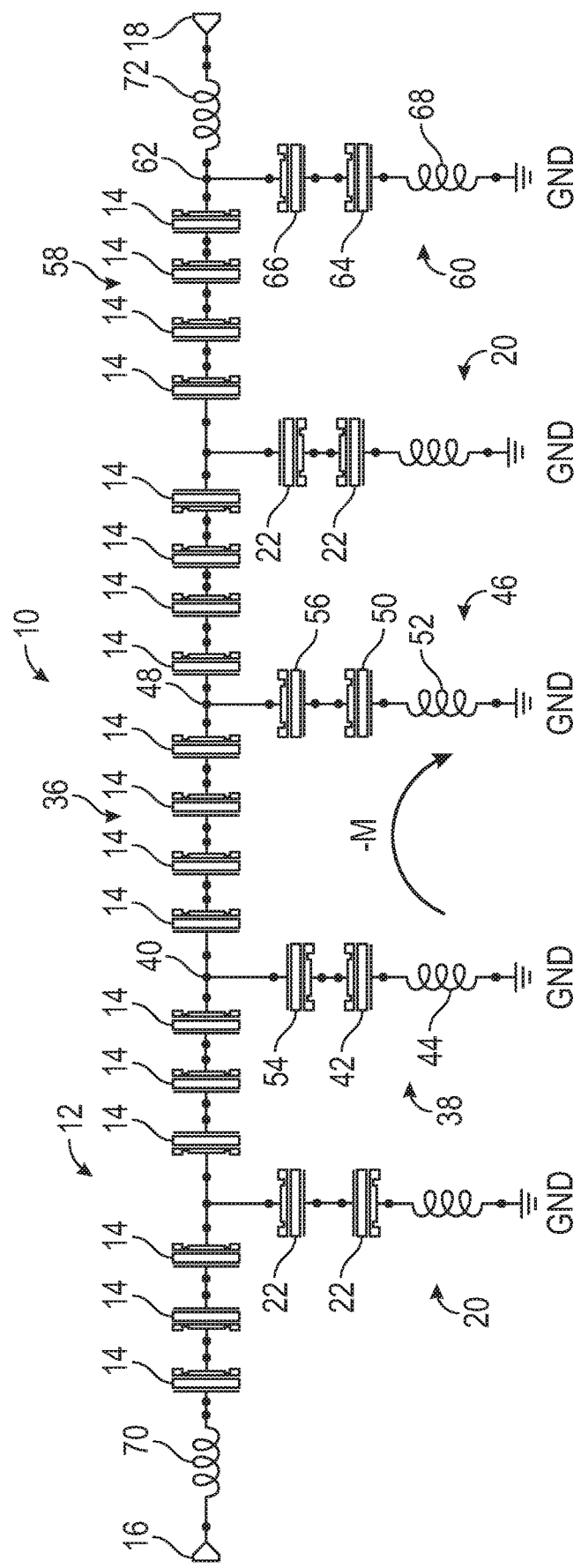
FIG. 4 is a schematic diagram of another exemplary RF ladder filter compensating for inductive parasitics of the semiconductor die.

FIG. 4 is a schematic diagram of another exemplary RF ladder filter 10 compensating for inductive parasitics of the semiconductor die. The RF ladder filter 10 includes the primary arm 12 having the ladder resonators 14 coupled in series between the first port 16 and the second port 18. The shunt arms 20 couple to the ground GND at nodes between the ladder resonators 14.

The primary arm 12 includes a first plurality of ladder resonators 36 (e.g., BAW resonators) coupled between the first port 16 and the second port 18. A first shunt arm 38 is coupled to a first end 40 (e.g., a first node) of the first plurality of ladder resonators 36 and coupled to the ground GND. The first shunt arm 38 includes a first shunt resonator 42 (e.g., a BAW resonator) and a first shunt inductor 44 coupled between the first shunt resonator 42 and the ground GND.

A second shunt arm 46 is coupled to a second end 48 (e.g., a second node) of the first plurality of ladder resonators 36 and coupled to the ground GND. The second shunt arm 46 includes a second shunt resonator 50 (e.g., a BAW resonator) and a second shunt inductor 52 coupled between the second shunt resonator 50 and the ground GND. The second shunt inductor 52 is negatively inductively coupled to the first shunt inductor 44. The negative mutual inductance −M between the first shunt inductor 44 and the second shunt inductor 52 compensates for inductive parasitics in the RF ladder filter 10.

In some examples, the shunt arms 20 include more than one resonator. For example, the first shunt arm 38 can include a first additional shunt resonator 54 in series with the first shunt resonator 42 (e.g., between the first shunt resonator 42 and the first end 40). The second shunt arm 46 can include a second additional shunt resonator 56 in series with the second shunt resonator 50 (e.g., between the second shunt resonator 50 and the second end 48).

In addition, the RF ladder filter 10 can include additional shunt arms 20. For example, a second plurality of ladder resonators 58 can be coupled in series between the first plurality of ladder resonators 36 and the second port 18. A third shunt arm 60 is coupled to a third end 62 of the second plurality of ladder resonators 58 and coupled to the ground GND. The third shunt arm 60 includes a third shunt resonator 64, which can be coupled in series with a third additional shunt resonator 66 and a third shunt inductor 68.

In some examples, the second port 18 can couple to the third end 62 of the second plurality of ladder resonators 58 without intervening resonators. In some examples, the primary arm 12 may include a first port inductor 70 directly coupled to the first port 16 and a second port inductor 72 directly coupled to the second port 18. Each of the first plurality of ladder resonators 36 and the second plurality of ladder resonators 58 can include four ladder resonators 14 as illustrated, or another quantity of ladder resonators 14 in series. The primary arm 12 may include additional ladder resonators 14 and shunt arms 20 according to desired filtering characteristics.

Figure 5:
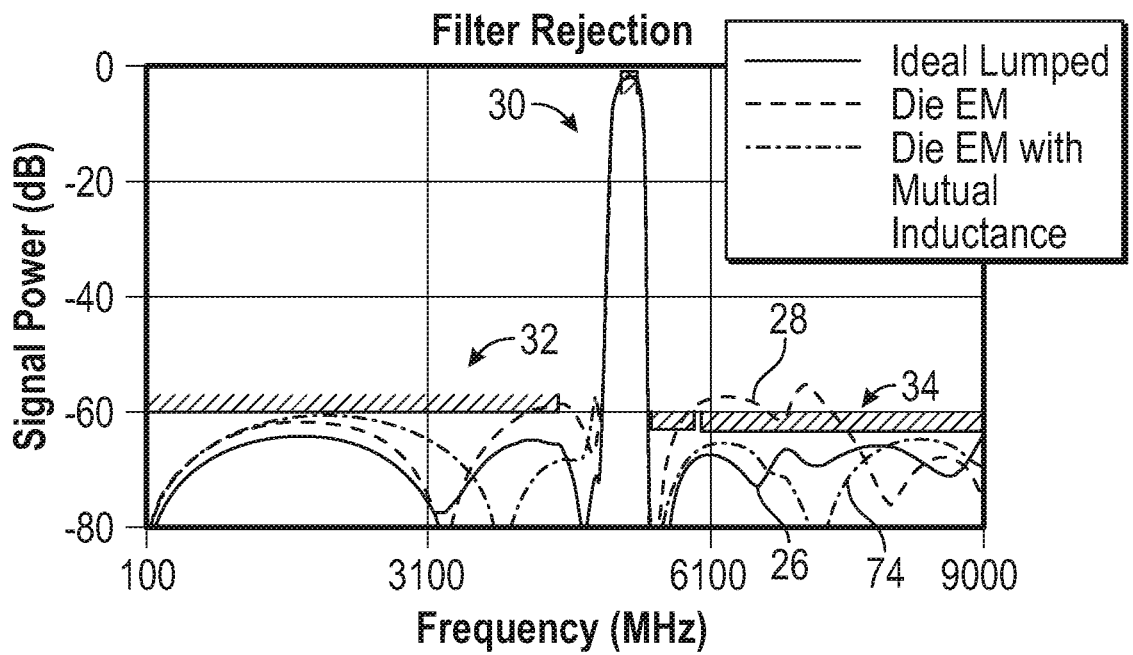
FIG. 5 is a graphical representation of filter performance, comparing ideal performance of the exemplary RF ladder filter of FIG. 1 with uncompensated performance of the semiconductor die of FIG. 2 and with compensated performance of the RF ladder filter of FIG. 4.

FIG. 5 is a graphical representation of filter performance, comparing the ideal performance 26 of the exemplary RF ladder filter 10 of FIG. 1 with the uncompensated performance 28 of the semiconductor die 24 of FIG. 2 and with compensated performance 74 of the RF ladder filter 10 of FIG. 4. As described above with respect to FIG. 2, the exemplary RF ladder filter 10 is a bandpass filter having the passband 30, the lower stopband 32, and the upper stopband 34.

As illustrated in FIG. 5, the compensated performance 74 of the RF ladder filter 10 of FIG. 4 (e.g., as implemented in further detail below in FIG. 6A or FIG. 7A) compensates for and/or reduces the inductive parasitics in the semiconductor die 24 of FIG. 2. In this regard, the negative coupling between the first shunt inductor 44 and the second shunt inductor 52 improves rejection of the RF ladder filter 10 outside the passband 30 as compared with the uncompensated performance 28.

In particular, the uncompensated performance 28 in the upper stopband 34 has less than the desired 60 dB rejection. However, the compensated performance 74 has greater than 60 dB of rejection in the upper stopband 34 and in most of the lower stopband 32, except for a small flyback adjacent the passband 30. Accordingly, the negative coupling between the first shunt inductor 44 and the second shunt inductor 52 reduces inductive parasitics and improves performance of the RF ladder filter 10.

Figure 6A:
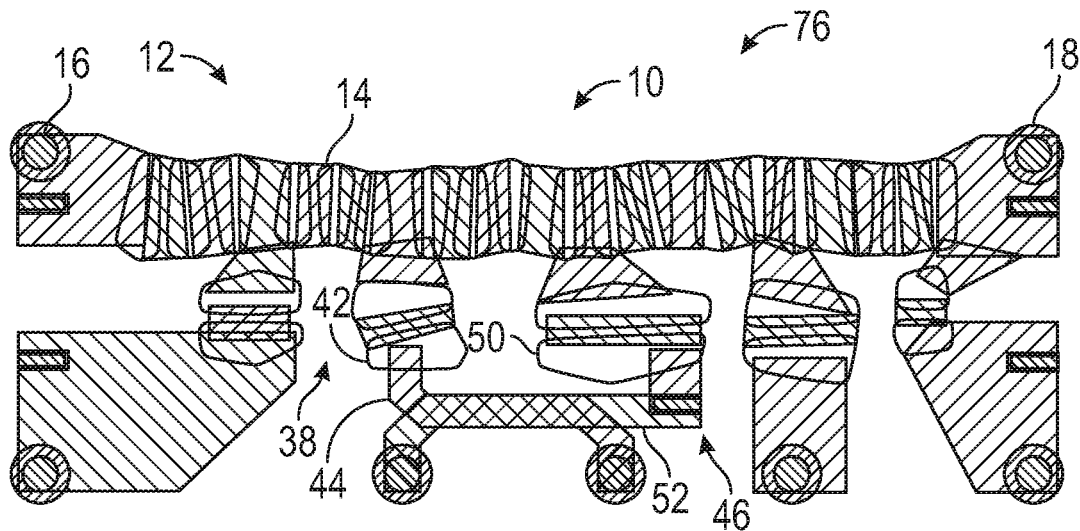
FIG. 6A illustrates an on-die implementation of the exemplary RF ladder filter of FIG. 4.

FIG. 6A illustrates an on-die implementation of the exemplary RF ladder filter 10 of FIG. 4. A semiconductor die 76 of FIG. 6A includes the RF ladder filter 10, including the negatively inductively coupled shunt inductors 44, 52, disposed over a semiconductor substrate (omitted from FIG. 6A for clarity). In this regard, the primary arm 12 (e.g., including the ladder resonators 14 in series) is formed over the semiconductor substrate. The first shunt arm 38 is formed over the semiconductor substrate by forming the first shunt resonator 42 over the semiconductor substrate and depositing the first shunt inductor 44 over the semiconductor substrate.

In addition, the second shunt arm 46 is formed over the semiconductor substrate by forming the second shunt resonator 50 over the semiconductor substrate and depositing the second shunt inductor 52 over the first shunt inductor 44. The second shunt inductor 52 is negatively inductively coupled to the first shunt inductor 52 by disposing the second shunt inductor 52 over the first shunt inductor 44 such that a first current through the first shunt inductor 44 flows an opposing direction from a second current through the second shunt inductor 52. In an exemplary aspect, an insulating layer is deposited between the first shunt inductor 44 and the second shunt inductor 52.

Figure 6B:
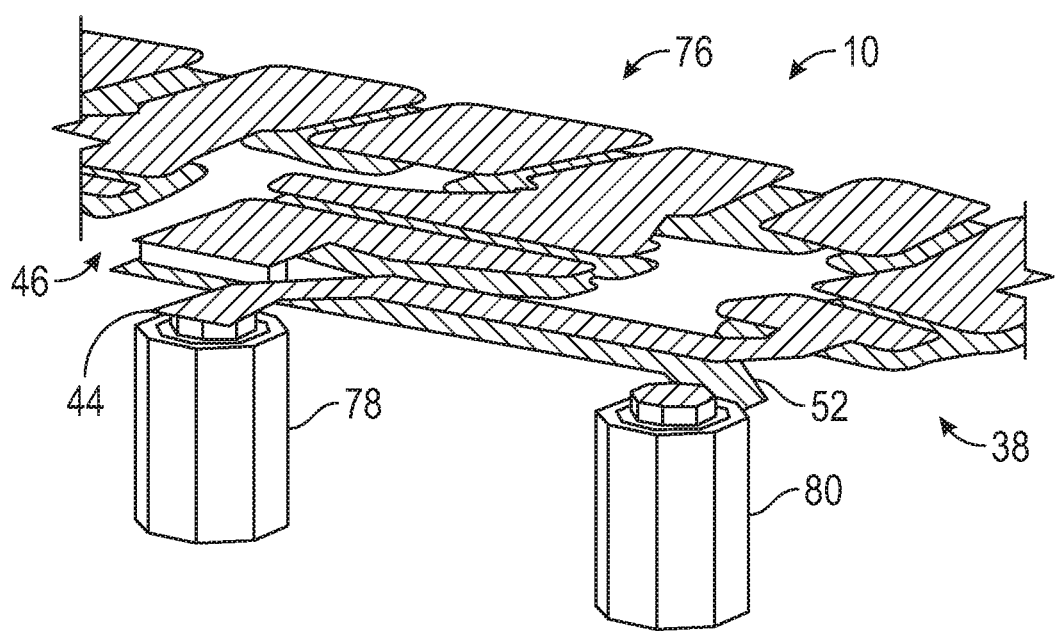
FIG. 6B is an inverted side view of the on-die implementation of FIG. 6A.

FIG. 6B is an inverted side view of the on-die implementation of FIG. 6A. A first ground pillar 78 is attached to the first shunt inductor 44 through an appropriate technique (e.g., mechanical, soldering, brazing, ultrasonic bonding, etc.) and configured to attach to a ground plane of a circuit board or other component separate from the semiconductor die 76. A second ground pillar 80 is attached to the second shunt inductor 52 through an appropriate technique and configured to attach to the ground plane of the circuit board or other component.

Figure 7A:
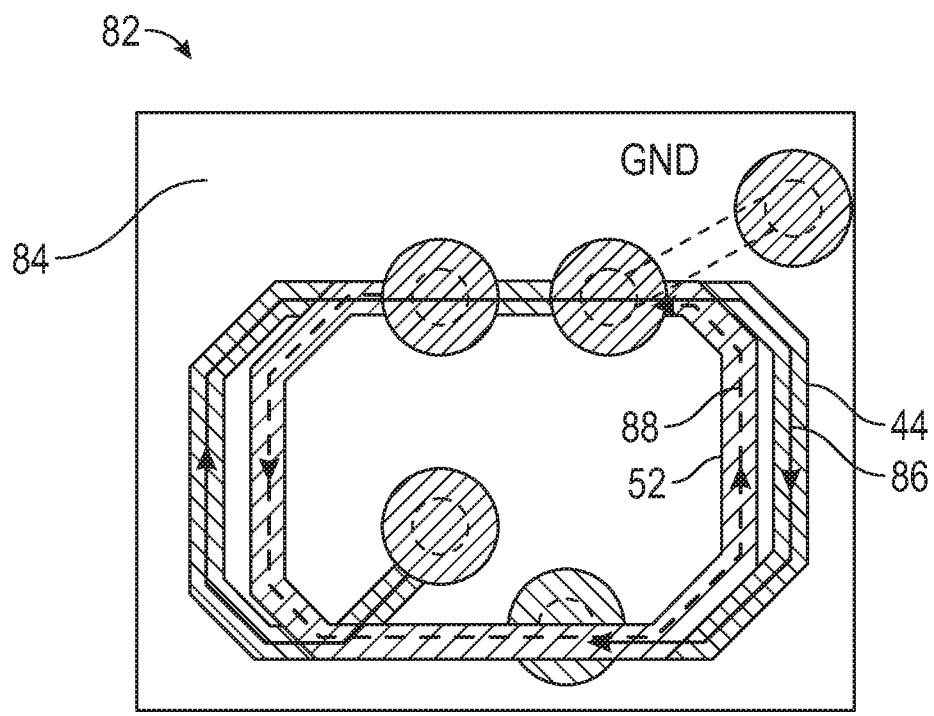
FIG. 7A illustrates another implementation of the exemplary RF ladder filter of FIG. 4.

FIG. 7A illustrates another implementation of the exemplary RF ladder filter 10 of FIG. 4. In some examples, the RF ladder filter 10 may be implemented using the semiconductor die 24 of FIG. 2 and coupled to an external substrate which includes the negatively inductively coupled first shunt inductor 44 and second shunt inductor 52. In this regard, a laminate substrate 82, such as a printed circuit board, includes a ground plane 84. The first shunt inductor 44 is disposed over and coupled to the ground plane 84, and the second shunt inductor 52 is disposed over the first shunt resonator 42 and coupled to the ground plane 84.

With continuing reference to FIGS. 4 and 7A, the first shunt inductor 44 couples the first shunt resonator 42 in the first shunt arm 38 to the ground GND via the ground plane 84. Similarly, the second shunt inductor 52 couples the second shunt resonator 50 in the second shunt arm 46 to the ground GND via the ground plane 84. In addition, the second shunt inductor 52 is disposed over the first shunt inductor 44 such that a first current 86 through the first shunt inductor 44 flows an opposing direction from a second current 88 through the second shunt inductor 52.

Figure 7B:
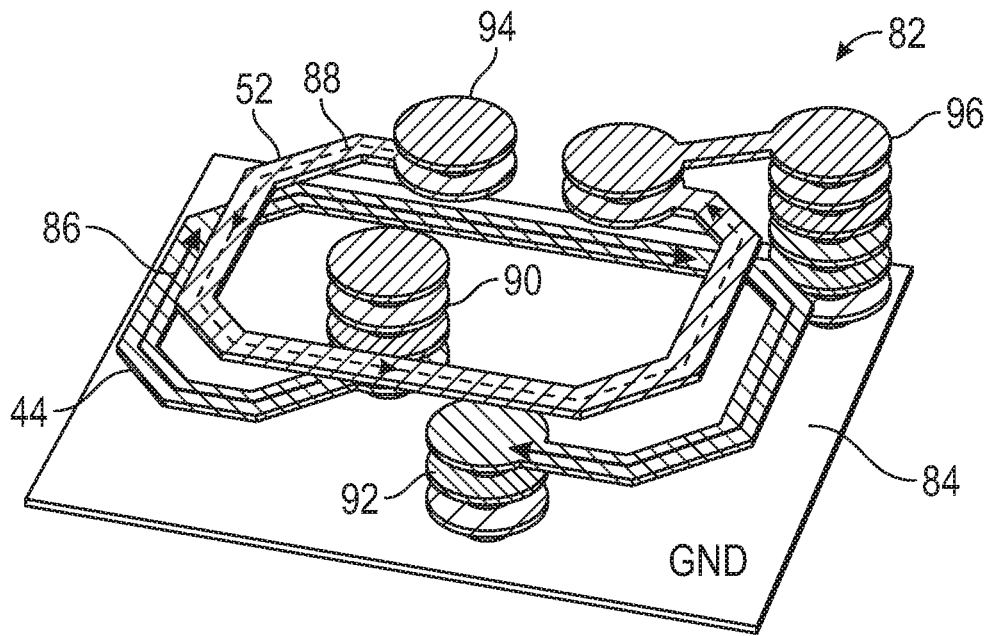
FIG. 7B illustrates a transparent isometric view of the implementation of FIG. 7A.

FIG. 7B illustrates a transparent isometric view of the implementation of FIG. 7A. As described with respect to FIG. 7A, the laminate substrate 82 can be a printed circuit board. In this regard, the first shunt inductor 44 couples to the first shunt resonator 42 in the semiconductor die 24 through a first shunt via 90 and couples to the ground plane 84 through a first ground via 92. The second shunt inductor 52 couples to the second shunt resonator 50 through a second shunt via 94 and couples to the ground plane 84 through a second ground via 96.

It should be understood that FIGS. 6A, 6B, 7A, and 7B are illustrative implementations of the RF ladder filter 10. In other examples, the negatively inductively coupled first shunt inductor 44 and second shunt inductor 52 may be disposed on separate substrates. For example, the first shunt inductor 44 may be disposed on a semiconductor substrate, while the second shunt inductor 52 is disposed on a laminate substrate 82 and positioned over the first shunt inductor 44.

Figure 8:
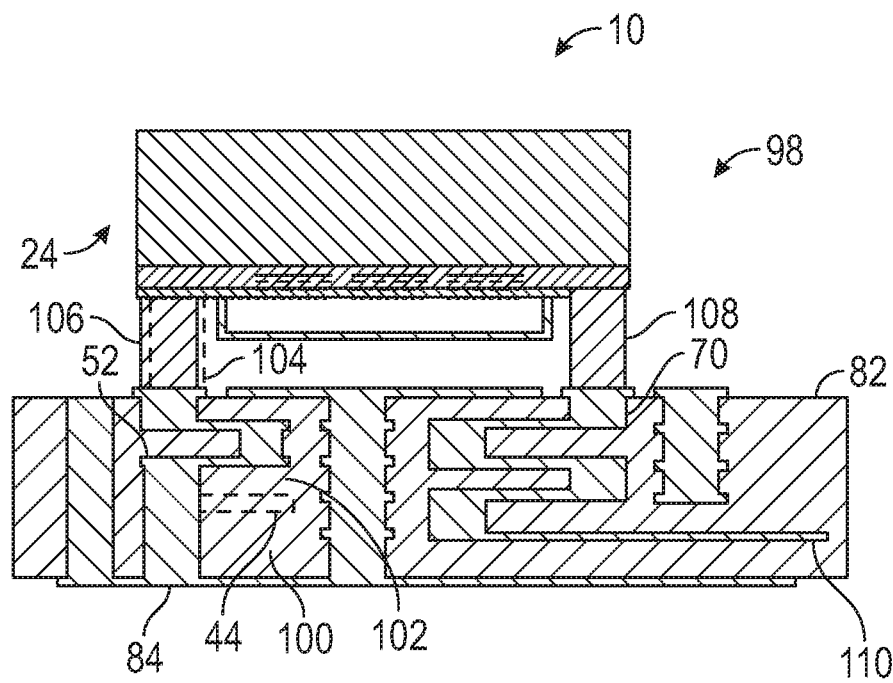
FIG. 8 is a cross-sectional view of an RF ladder filter package, including the semiconductor die of FIG. 2 coupled to the laminate substrate of FIG. 7A.

FIG. 8 is a cross-sectional view of an RF ladder filter package 98, including the semiconductor die 24 of FIG. 2 coupled to the laminate substrate 82 of FIG. 7A. The RF ladder filter package 98 implements the RF ladder filter 10 of FIG. 4 by coupling the laminate substrate 82 (which includes the negatively inductively coupled inductors 44, 52) to the semiconductor die 24. The laminate substrate 82 includes the first shunt inductor 44 disposed on a first insulating layer 100. A second insulating layer 102 is disposed over the first shunt inductor 44, and the second shunt inductor 52 is disposed on the second insulating layer 102 over the first shunt inductor 44.

In an exemplary aspect, the semiconductor die 24 is coupled to the laminate substrate 82 by conductive pillars. For example, a first conductive pillar 104 is coupled between the first shunt inductor 44 and the first shunt resonator 42 and a second conductive pillar 106 is coupled between the second shunt inductor 52 and the second shunt resonator 50. One or more additional conductive pillars 108 can be coupled to the first port 16, the second port 18, and/or other points in the RF ladder filter 10. For example, an additional conductive pillar 108 can couple the first port 16 to a signal conductor 110 in the laminate substrate 82 to provide an RF signal to be filtered by the RF ladder filter 10 in the semiconductor die 24. In some examples, the laminate substrate 82 can further include the first port inductor 70 coupled between the additional conductive pillar 108 and the signal conductor 110.

Figure 9:
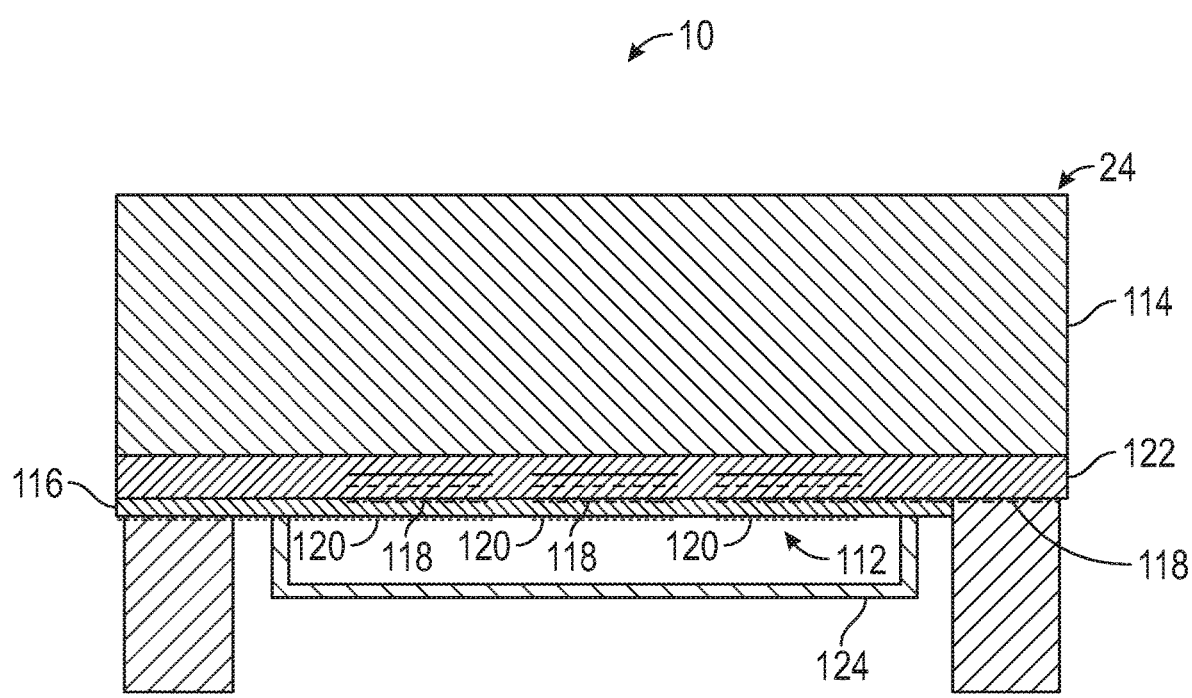
FIG. 9 is a cross-sectional view of the RF ladder filter of FIG. 4, implemented on the semiconductor die of FIG. 2 or the semiconductor die of FIG. 6A.

FIG. 9 is a cross-sectional view of the RF ladder filter 10 of FIG. 4, implemented on the semiconductor die 24 of FIG. 2 or the semiconductor die 76 of FIG. 6A. The RF ladder filter 10 can be implemented with BAW resonators 112. Accordingly, the semiconductor die 24 (or the semiconductor die 76) includes a semiconductor substrate 114 over which the BAW resonators 112 of the primary arm 12, the first shunt arm 38, the second shunt arm 46, and the additional shunt arms 20 are formed (e.g., as described above with respect to FIG. 6A).

In an exemplary aspect, each BAW resonator 112 includes a piezoelectric layer 116 between a bottom electrode 118 and a top electrode 120 The BAW resonators 112 can be formed by depositing the bottom electrode 118 over the semiconductor substrate 114, depositing the piezoelectric layer 116 over the bottom electrode 118, and depositing the top electrode 120 over the piezoelectric layer 116. In some examples, a reflector 122 is formed between the bottom electrodes 118 and the semiconductor substrate 114 to improve performance of the BAW resonators 112 of the RF ladder filter 10. In some examples, a polymer cavity 124 is formed over the BAW resonators 112 to protect and/or isolate them.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) ladder filter, comprising:
    a plurality of resonators coupled in series between a first port and a second port;
    a first shunt arm coupled between a first node in the plurality of resonators and a ground, comprising:
        a first shunt resonator; and
        a first shunt inductor coupled between the first shunt resonator and the ground; and
    a second shunt arm coupled between a second node in the plurality of resonators and the ground, comprising:
        a second shunt resonator; and
        a second shunt inductor coupled between the second shunt resonator and the ground and negatively inductively coupled to the first shunt inductor, wherein the negative coupling between the first shunt inductor and the second shunt inductor improves rejection of the RF ladder filter.

2. The RF ladder filter of claim 1, wherein:
    the first shunt inductor is disposed on a substrate; and
    the second shunt inductor is disposed over the first shunt inductor such that a first current through the first shunt inductor flows an opposing direction from a second current through the second shunt inductor.

3. The RF ladder filter of claim 2, wherein:
    the substrate comprises a semiconductor substrate; and
    the plurality of resonators are formed over the semiconductor substrate.

4. The RF ladder filter of claim 2, wherein the substrate comprises an insulating layer of a circuit board separate from and coupled to the plurality of resonators.

5. The RF ladder filter of claim 4, further comprising:
    a first conductive pillar coupled between the first shunt inductor and the first shunt resonator; and
    a second conductive pillar coupled between the second shunt inductor and the second shunt resonator.

6. The RF ladder filter of claim 1, wherein at least one of the plurality of resonators comprises a bulk acoustic wave (BAW) resonator.

7. The RF ladder filter of claim 1, wherein the RF ladder filter comprises a bandpass filter.

8. The RF ladder filter of claim 7, wherein the negative coupling between the first shunt inductor and the second shunt inductor reduces inductive parasitics in the plurality of resonators, the first shunt arm, and the second shunt arm.

9. A method for forming a radio frequency (RF) ladder filter, comprising:
    providing a semiconductor substrate;
    forming a plurality of resonators in series over the semiconductor substrate;
    forming a first shunt arm over the semiconductor substrate by:
        forming a first shunt resonator coupled to a first node in the plurality of resonators; and
        coupling a first shunt inductor to the first shunt resonator; and forming a second shunt arm over the semiconductor substrate by:
forming a second shunt resonator coupled to a second node in the plurality of resonators; and
coupling a second shunt inductor to the second shunt resonator;
wherein the second shunt inductor is disposed over the first shunt inductor such that a first current through the first shunt inductor flows an opposing direction from a second current through the second shunt inductor.

10. The method of claim 9, further comprising:
depositing the first shunt inductor over the semiconductor substrate; and
depositing the second shunt inductor over a laminate substrate.

11. The method of claim 9, further comprising:
depositing the first shunt inductor over the semiconductor substrate;
depositing an insulating layer over the first shunt inductor; and
depositing the second shunt inductor onto the insulating layer over the first shunt inductor.

12. The method of claim 11, further comprising:
attaching a first ground pillar configured to attach a circuit board to the first shunt inductor; and
attaching a second ground pillar configured to attach the circuit board to the second shunt inductor.

13. The method of claim 12, further comprising connecting the first ground pillar and the second ground pillar to a ground plane in the circuit board.

14. The method of claim 9, further comprising:
providing a circuit board comprising:
the first shunt inductor disposed on a first insulating layer;
a second insulating layer disposed over the first shunt inductor; and
the second shunt inductor disposed on the second insulating layer over the first shunt inductor;
coupling a first conductive pillar between the first shunt inductor and the first shunt resonator; and
coupling a second conductive pillar between the second shunt inductor and the second shunt resonator.

15. A radio frequency (RF) bandpass filter, comprising:
a primary arm comprising a first plurality of resonators coupled in series between a first port and a second port;
a first shunt arm coupled to a first end of the first plurality of resonators and coupled to a ground, comprising:
a first shunt resonator; and
a first shunt inductor coupled between the first shunt resonator and the ground; and
a second shunt arm coupled to a second end of the first plurality of resonators and coupled to the ground, comprising:
a second shunt resonator; and
a second shunt inductor coupled between the second shunt resonator and the ground and negatively inductively coupled to the first shunt inductor, wherein the negative coupling between the first shunt inductor and the second shunt inductor improves rejection of the RF bandpass filter outside a passband of the RF bandpass filter.

16. The RF bandpass filter of claim 15, further comprising:
a second plurality of resonators coupled in series between the first plurality of resonators and the second port; and
a third shunt arm coupled to a third end of the second plurality of resonators and coupled to the ground, comprising a third shunt resonator.

17. The RF bandpass filter of claim 15, wherein:
the first shunt inductor is disposed on a substrate; and
the second shunt inductor is disposed over the first shunt inductor such that a first current through the first shunt inductor flows an opposing direction from a second current through the second shunt inductor.

18. The RF bandpass filter of claim 15, wherein:
the first shunt inductor is disposed on a semiconductor substrate; and
the second shunt inductor is disposed over the first shunt inductor on a laminate substrate.

* * * * *